United States Patent
Burger et al.

(10) Patent No.: US 6,220,203 B1
(45) Date of Patent: Apr. 24, 2001

(54) DEVICE FOR VACUUM COATING BULK MATERIAL

(75) Inventors: Kurt Burger, Friolzheim; Johannes Voigt, Leonberg; Wolfgang Reuter, Florstadt, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/142,647
(22) PCT Filed: Feb. 27, 1997
(86) PCT No.: PCT/DE97/00344
§ 371 Date: Jun. 24, 1999
§ 102(e) Date: Jun. 24, 1999
(87) PCT Pub. No.: WO97/34024
PCT Pub. Date: Sep. 18, 1997

(30) Foreign Application Priority Data

Mar. 13, 1996 (DE) ............................................. 196 09 804.1

(51) Int. Cl.[7] .................................................. C23C 16/00
(52) U.S. Cl. .................................. 118/723 MW; 118/728; 118/730; 204/298.28
(58) Field of Search ....................................... 118/728, 729, 118/730, 731, 716, 723 R, 723 E, 723 MW; 204/298.15, 298.23, 298.24, 298.28, 298.29, 192.12, 192.3, 192.32

(56) References Cited

U.S. PATENT DOCUMENTS 5,470,388 * 11/1995 Goedicke et al. .................... 118/716
6,090,247 * 7/2000 White et al. ..................... 204/298.26

FOREIGN PATENT DOCUMENTS

| 257 554 | 6/1988 | (DD) . |
| 42 09 384 | 4/1993 | (DE) . |
| 42 39 843 | 6/1994 | (DE) . |
| 43 43 354 | 6/1995 | (DE) . |
| 44 22 688 | 1/1996 | (DE) . |
| 5-271921 * | 10/1993 | (JP) . |

OTHER PUBLICATIONS

"Sputter Cleaning And Plating Small Parts", Mattox and Rebarchik, Electrochemical Technology, vol. 6, No. 9–10, pp. 374–375, Sep. 1968*.

"A Simple And Inexpensive Rotating Barrel To Ion Plate Small Components", Ahmed and Teer, Journal Of Physics and Scientific Instruments, vol. 17, No. 5, pp. 411–416, May 1984*.

* cited by examiner

Primary Examiner—Gregory Mills
Assistant Examiner—Luz Alejandro
(74) Attorney, Agent, or Firm—Kenyon & Kenyon

(57) ABSTRACT

A device for vacuum coating bulk material includes a rotating holder for accommodating the bulk material, a plasma coating source arranged within the rotating holder, as well as a device, arranged within the rotating holder, for cleaning the bulk material using plasma. During the coating process, the rotational speed of the rotating holder is less than the speed necessary for producing a centrifugal force for fixing the bulk material against the inner wall of the rotating holder. The plasma coating source and the plasma cleaning device are arranged in such a way that their spheres of action overlap.

12 Claims, 1 Drawing Sheet

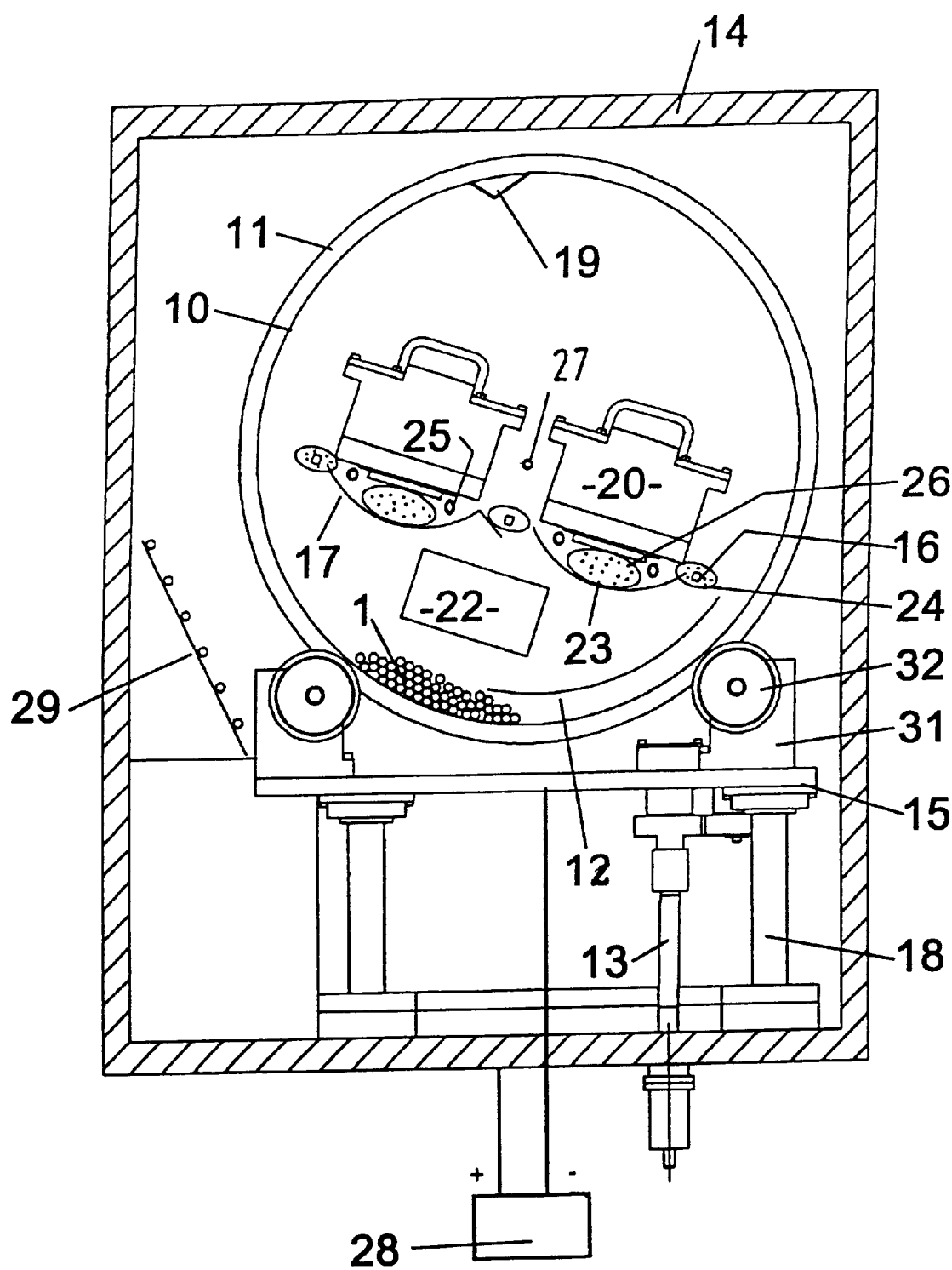

DEVICE FOR VACUUM COATING BULK MATERIAL

BACKGROUND INFORMATION

The present invention relates to a device for coating bulk material. A device for coating bulk material is described in East German Patent No. 25 75 54, which describes a device that includes a rotating holder for accommodating bulk material to be coated, as well as a plasmatron sputter source arranged within the rotating holder. The plasmatron sputter source is directed downward, such that the bulk material to be coated always stays within its sphere of action during the rotation of the rotating holder. Located on the inner wall of the rotating holder are control devices which ensure good intermixture of the bulk material during the rotation. The device allows the manufacture of single-layer metallic coatings having average adherence. The device does not possess means for producing layers having specific predefined properties. Thus, in particular process steps for increasing the adherence of an applied coating, or the production of multilayer systems, are not shown.

Another vacuum bulk-material coating device, in which the bulk material to be coated is moved in a rotating holder about a coating source, is described by the German Patent No. 42 09 384. Used here as the coating source is an electron-bean vaporizer which—subject to the principle—acts upwards. To produce high-quality coatings, also located in the interior of the rotating holder is a plasma or ion source whose direction of action is rotated by approximately 120 degrees with respect to the electron-beam vaporizer. For the coating process, the rotating holder is set into fast rotation. The centrifugal force occurring in so doing holds the bulk material to be coated against the inner wall of the rotating holder. The bulk material thus fixed against the inner wall of the rotating holder is conveyed in succession through the spheres of action of the electron-beam vaporizer and of the plasma/ion source. A stripping-off device engaging in the upper area of the rotating holder loosens the bulk material from the inner wall, and thereby constantly changes the position of the bulk material to be coated. This device permits coatings to be produced having different properties according to the present invention. However, the necessary rapid rotation of the rotating holder, in conjunction with the stripping process engaging in a correspondingly hard manner, leads easily to damage of the components to be coated. Therefore, particularly in the case of components having many edges, one must be prepared for a high rate of reject material.

To bring about specific physical properties for a coating, it is furthermore known (from German Published Patent Application Nos. 42 39 843 and 43 43 354) to carry out the coating process, while adding reactive gases in variable concentrations. However, known coating devices of this type are restricted to the coating of stationary objects, and do not allow coating of bulk goods.

SUMMARY OF THE INVENTION

An object of the present invention is to provide a coating device which makes it possible to provide small parts, as bulk material, with coatings all-round having physical properties that are specifiable within a wide framework.

With the aid of the device of the present invention, the economic efficiency of coating components improves considerably. This holds true in particular for coating with layers to be applied in several process steps and the production of multilayer coatings. The device according to the present invention makes it possible to produce a multitude of different coatings with a single device. Because of the slow rotational speed of the rotating holder, the risk of damaging the components to be coated while rotating is small. The incorporation into the rotating holder of a device for producing a cleaning plasma is advantageous for achieving a high coating quality. By removing foreign materials before the actual coating, it assures high adherence of the applied coatings.

Advantageously, an ECR (electron-cyclotron-resonance) plasma is used as cleaning plasma. To produce it, a magnet arrangement and a microwave coupling device are located in the interior of the rotating holder. The microwaves emanating therefrom interact resonantly with those electrons in the magnetic field whose gyration frequency matches the microwave frequency. Advantageously located outside of the rotating holder, but within the vacuum device, is furthermore a heating device, by which the components to be coated are outgassed before the start of the coating process. In addition, applied expediently to the rotating holder is a voltage, by which the bulk material to be coated is brought to a negative potential. In this manner, the flow of positive ions in the direction of the bulk material is increased, whereby the quality of the coatings produced, as well as the cleaning and coating speed can be specifically influenced. By suitable restrictors, the coating area can be restricted to the surface of the components to be coated, an undesired coating of the rotating-holder inner surface being prevented.

To achieve particularly hard coatings, it has proven advantageous to deposit the coatings, accompanied by simultaneously burning ECR plasma.

BRIEF DESCRIPTION OF THE DRAWING

The FIGURE shows a vacuum coating device according to the present invention for coating components present as bulk material.

DETAILED DESCRIPTION

The FIGURE shows a coating device according to the present invention that includes a recipient unit 14 (otherwise referred to as recipient 14), in which is arranged a rotating holder 10 in the form of a cylindrical drum having end faces running in a conically expedient manner. Rotating holder 10 is rotatable around to the left and to the right. In the interior of rotating holder 10 are two plasma coating sources 20, known per se, a magnet arrangement 16, as well as a microwave coupling device 22. Components 16, 20, 22 are referred to either as interior components 16, 20, 22 or coating devices 16, 20, 22. All interior components 16, 20, 22 are mounted on a shared mounting support and are rotatable as an entirety about an axis of rotation 27 situated in the center of rotating holder 10. Moreover, together with rotating holder 10, components 16, 20, 22 are removable from recipient 14, or rotating holder 10 is able to be pulled off from interior components 16, 20, 22. To that end, recipient 14 has a vacuum flange 11 toward one side, by which rotating holder 10 can be moved out of recipient 14. On its inner wall, rotating holder 10 has baffle plates 19 which are used for circulating bulk material 1 to be coated.

Rotating holder 10 moves on a rotating-holder bearing 31 that is arranged within recipient 14 and, on its part, is secured by way of a support arrangement 18 to recipient 14. Rotating-holder bearing 31 includes a base plate 15 having bearing rollers 32 which support rotating holder 10. Base plate 15, bearing rollers 32 and rotating holder 10 are electrically insulated with respect to recipient 14, support arrangement 18, as well as with respect to coating devices 16, 20, 22 located in the interior of rotating holder 10. Also located in the recipient interior and likewise electrically insulated with respect to base plate 15 is a driving device 13 which acts by way of a power-transmission device, not shown, on rotating holder 10 in order to set rotating holder 10 into rotation. Driving device 13 is led out of recipient 14 to a motor, likewise not shown, arranged outside of recipient 14. Rotating holder 10 is connected via electrically conductive bearing rollers 32 and likewise electrically conductive base plate 15 to a power supply unit 28 that is preferably located outside of the recipient 14. Using power supply unit 28, it is possible to energize rotating holder 10 depending on the application. Expediently, power supply unit 28 allows the application of electrical direct-voltage potentials of 0 to 1200 V, pulsed unipolar or bipolar direct-voltage potentials with −10 kV to +500 V, as well as of high-frequency voltages in the Khz range to MHz range with −3000V to +3000 V.

Located furthermore within recipient 14, but outside of rotating holder 10, is a heating device 29 for heating bulk material 1. Heating device 29 is arranged in coordination with the rotational speed of rotating holder 10 and the geometry of the components to be coated, such that it is located under bulk material 1 which is moving in the direction of rotation as a result of the rotating-holder movement and of the component geometry. If rotating holder 10 is moved in both directions of rotation, a further heating device 29 is expediently provided symmetrically to the first heating device 29, under the opposite half of the rotating holder 10, as indicated in the FIGURE.

A movable shielding plate 17 is allocated in each case to the open sides of coating sources 20. The shielding plates 17 are able to swivel in front of coating sources 20 if necessary, so that no coating material gets from coating sources 20 onto bulk material 1 to be coated. Used expediently as coating sources 20 are generally known plasmatron sputter sources, as are customary for PVD coating. They produce on their discharge side a cathode plasma 23 which contains ions from material sputtered off from a target 26. To control the direction and intensity of the ion flow, coating sources 20 are expediently provided with suitable control devices such as coils, which generate unbalanced magnetic fields. In the same way, provision can be made for auxiliary anodes which, with the aid of positive voltages, permit influence of the ion flow. Around the plasmatron cathode and target 26 at each coating source 20, a gas inlet 25 is formed, through which reactive gases are able to be fed into the interior of rotating holder 10. Arranged more or less at the height of cathode plasma 23, produced by plasmatron sputter sources 20, are magnet arrangement 16 and microwave coupling device 22. Together, they form an ECR device for producing an ECR plasma 24 that develops around magnet arrangement 16. Suitable restrictors 18 are arranged between bulk material 1 and coating sources 20 with the ECR device, in order to avoid coating the entire rotating holder 10 due to coating material spreading uniformly in the interior.

The installation described above permits three-dimensional coating, precipitating uniformly to all sides, of mass-produced components which, at the same time, are manipulable as bulk material 1. In the following discussion, the principle sequence of a coating operation is described by way of example.

For the coating process, the components to be coated, hereinafter designated simply as bulk material 1, are introduced into rotating holder 10. Recipient 14 is evacuated to a pressure of approximately $10^{-5}$ mbar.

In a first processing step, bulk material 1 is now heated with the aid of heating device 29, in order to outgas vaporizable foreign matter which may be present.

The feeding of a process gas, generally argon, is subsequently begun with a defined flow, so that a typical operating pressure of $10^{-3}$ mbar sets in. Thereupon, rotating holder 10 is set into motion. During the rotation, baffle plates 16 continually rearrange bulk material 1, so that given sufficient dwelling time, all the sides of the components forming the bulk material 1 point for a uniformly long time in the direction of the interior of the rotating holder 10.

Following the thermal pre-cleaning is a step for cleaning targets 26 by sputtering. To that end, coating sources 20 are initially operated with pre-swivelled shielding plates 17, so that foreign matter present on or within coating sources 20 cannot deposit on the bulk material 1. Foreign matter forms, for instance, on targets 26 by decomposition of process gas, as a result of which, at the end of the process, targets 26 are coated, e.g., with carbon. Upon opening recipient 14 to remove coated bulk material 1, an oxide layer forms with the atmospheric oxygen, which is not wanted for a subsequent coating. Thus, in the first operating phase, possibly present foreign matter settles on shielding plates 17.

In the following process step, bulk material 1 is fine cleaned using plasma in an ECR plasma 24 produced for this purpose. In this context, in order to achieve good effectiveness, ECR device 16,24 is aligned around axis of rotation 27 in the direction of the position of bulk material 1 which is adjusting according to the rotational movement of rotating holder 10. Microwaves are then coupled by way of microwave coupling device 22 into the interior of rotating holder 10, the microwaves interacting with the ions and electrons moving in the magnetic field of magnet arrangement 16. In the process, a resonant interaction takes place with those electrons whose gyration frequency agrees with the frequency of the microwave field. Due to the resonance interaction, an ECR plasma 24 forms about magnet arrangement 16. The ions contained therein clean bulk material 1 by the sputter effect resulting upon striking. To increase the cleaning effectiveness, and to improve the cleaning speed, an electric potential is applied to rotating holder 10 which results in an electrically negative charging of bulk material 1. If the bulk material 1 is composed of conductive components, in doing this, a negative voltage in the order of magnitude of, e.g., −1000 V is applied in simple manner to rotating holder 10. Alternatively, a pulsed, higher direct voltage with up to −10 KV can be applied. If bulk material 1 are components made of insulating material, a high-frequency, alternating voltage lying in the KHz or MHz range with an amplitude of preferably up to 3000 V is applied to rotating holder 10.

After the cleaning of the bulk material 1 is completed, ECR device 16,24 is switched off, and the coating deposition onto bulk material I with the aid of coating sources 20 begins. For this purpose, cleaned coating sources 20 are switched on, and shielding plates 17 are swivelled out of the way of the outlets of coating sources 20.

To increase the coating effectiveness, bulk material 1 to be coated is in turn electrically negatively charged by applying a suitable potential to rotating holder 10. However, in contrast to the preceding cleaning step, where the plasma ions were used to attain a sputter effect on the bulk material, at this point, plasma ions should be accumulated on bulk material 1, a chemical activation of the bulk-material surface should be produced simultaneously by the feeding of kinetic ion energy, and in addition, the surface of the bulk material 1 should be compacted. The voltages to be applied to rotating holder 10 must be adapted to this; generally, a smaller amplitude must be adjusted compared to the cleaning phase. If, for example, a negative voltage of −1000 V was applied for the cleaning phase, a negative direct voltage of −500 V is sufficient for the coating., At this point, layers having different physical properties are applied in free succession in the desired thickness and number onto bulk material 1 while adding alternating, in each case suitable process gases such as Ar, N, $C_2H_2$, $CH_4$, $O_2$, $H_2$, etc. via gas inlets 25. In so doing, the process temperature, which preferably is less than 200°, can be changed if necessary, in particular can be raised for a time with the aid of heating device 29.

When using a plurality of coating sources 20, targets 26 can be made of various materials, which permits a correspondingly variable build-up of layers on bulk material 1. For example, a target 26, with which an adhesion layer is produced on bulk material 1, can be allocated to a first coating source 20; a target 26, with which a functional layer is produced, can be allocated to a second coating source 20. In this case, coating sources 20 are advisably inclined away from each other, the coating preferably being carried out in succession. At the same time, rotating holder 10 is rotated around to the left or right according to coating source 20 which is active at any one time, so that in each case, bulk material 1 is located in front of coating source 20 which is presently active. The application of layers can be interrupted at any time in order, for example, to carry out an interposed cleaning step by applying an ECR plasma 24 with the aid of ECR device 16, 24. To avoid soiling due to pitching or rubbing motions between the components forming the bulk material 1, it can be useful to rotate rotating holder 10 in the form of a start-stop operation, during which rotating holder 10 is stopped at regular intervals.

Using the arrangement described above, components present in the form of bulk material 1 can be provided in particular with a multilayer coating. The basic structure of such multilayer coatings is described, for example, in the German Published Patent Application No. 43 43 354 for coating systems based on titanium nitride. This basic structure includes a functional layer having a special desired property, e.g., great hardness, which is joined via one or more intermediate layers through to a component. In this context, depending on the application case, the intermediate layers are used to promote adhesion between the component and the functional layer, to bring about a supporting effect, for smoothing, for inhibiting diffusion, or for adapting the mechanical properties of the component and the functional layer such as, for instance, the thermal expansion, inner tensions, or the elasticity. At the same time, each intermediate layer can fulfill a different function.

It was possible to implement a multitude of various functional layers using the arrangement according to the FIGURE. Following, a few are specified by way of example.

It turned out that, in particular, the coating arrangement of the present invention permits an economical coating of bulk material with metal-containing carbon layers.

Implemented thus were, inter alia, functional layers made of stoichiometric and non-stoichiometric carbides, nitrides, oxides, borides, sulphides, silicides or their mixtures such as, for example, $Me_xC_y$, $Me_xC_yN_z$, $Me_xC_y$, $Me_xO_y$, $Me_xO_yN_z$, $Me_xSi_y$, $Si_xN_y$, $Si_xO_y$. Such a functional layer was made of hydrocarbons i-C(Me) or i-C(MeC) containing metal or metal carbide, the metal-carbide crystals having been present in carbon or hydrocarbon matrix, into which, in addition, further elements such as nitrogen, oxygen, boron, silicon or nitrides derived therefrom, oxides, borides, sulphides, silicides, or mixtures thereof were incorporated at a concentration of 0 to 60% by volume.

Also implemented was a functional layer in the form of a silicon layer i-Si(Me) or i-Si(MeSi) containing metal or metal silicide, the metal-silicide crystals having been present in silicon- or silicon-hydride matrix, into which, in addition, further elements such as nitrogen, oxygen, boron, carbon or nitrides derived therefrom, oxides, borides, sulphides, carbides or mixtures thereof were incorporated at a concentration of 0 to 60% by volume.

A further functional layer was implemented as an amorphous layer system made of carbon (a-C) or hydrocarbon (a-C:H) having additives of the elements N, O, B, Si, F, Ge at concentrations of 0 to 60% by volume.

In analogous manner, a functional layer was implemented in the form of an amorphous layer system based on silicon (a-Si) or silicon hydride (a-Si:H).

Besides metal-containing carbon layers, a functional layer was furthermore implemented in the form of a plasma polymer layer having additives of carbides, nitrides, oxides, borides, sulphides, silicides or mixtures thereof, at a concentration of 0 to 50% by volume.

On the basis of $MoS_2$, functional layers were furthermore implemented in the form of sulphidic layer systems, to which stabilizing additives were admixed.

The functional layers specified can be combined with one another in a multi-layer layer system. With respect to the attainable layer hardness, especially good results were furthermore attained when the layer deposition on bulk material 1 by coating sources 20 was carried out accompanied by simultaneously burning ECR plasma 24.

A multitude of variants is conceivable for the preceding arrangement, while retaining the basic concept. Thus, coating source 20 can also be implemented as an arc cathode or hollow cathode, or, when using two coating sources, the magnetron magnetic fields can be aligned inversely or in the same direction. In addition to the parallel alignment of targets 26 indicated in the FIGURE, they can also be aligned facing away from each other or facing each other. Furthermore, to fine-clean bulk material 1 using plasma, an arc plasma produced, for instance, by a hollow-cathode arc can be used instead of an ECR device. Another alternative for the use of an ECR device 16,24 provides for employing coating sources 20 for the fine plasma cleaning as well. The coating sources are operated, however, with reduced power compared to the actual coating process.

What is claimed is:

1. A device for vacuum coating bulk material including a plurality of parts, comprising:

a rotating holder for accommodating the bulk material;

a plasma coating source arranged within the rotating holder, a rotational speed of the rotating holder being less than a speed for producing a centrifugal force for fixing the bulk material against an inner wall of the rotating holder such that the plurality of parts are under an effect of a gravitational force and are located in a spatially small area in a lower section of the rotating holder; and a device for cleaning the bulk material using a plasma and arranged within the rotating holder, the device for cleaning the bulk material being aligned with respect to an axis of rotation of the rotating holder in a direction of a position of the bulk material so that spheres of action of the plasma coating source and spheres of action of the device for cleaning the bulk material overlap.

2. The device according to claim 1, wherein the device for cleaning the bulk material includes a microwave coupling device and a magnet arrangement for interacting with the microwave coupling device to develop an ECR plasma.

3. The device according to claim 1, further comprising a heating device arranged at a periphery of the rotating holder.

4. The device according to claim 1, wherein a voltage is applied to the rotating holder to apply an electrically negative potential to the bulk material.

5. The device according to claim 1, wherein the rotating holder includes a gas inlet for introducing a reactive gas into an interior of the rotating holder.

6. The device according to claim 1, wherein the rotating holder is coupled to each one of the plasma coating source and to the device for cleaning the bulk material via a corresponding detachable connection.

7. The device according to claim 1, wherein the plasma coating source includes a first plasma coating source for depositing a first coating material, and a second plasma coating source for depositing a second coating material that is different than the first coating material.

8. The device according to claim 1, wherein the plasma coating source includes a first plasma coating source having a sphere of action, and a second plasma coating source having a sphere of action and being inclined away from the first plasma coating source so that the sphere of action of the first plasma coating source and the sphere of action of the second plasma coating source do not overlap.

9. The device according to claim 1, wherein the bulk material is coated with carbon layers including one of a metal and a metal carbide.

10. The device according to claim 1, wherein the bulk material is coated with metal-free amorphous carbon layers including one of N, Si, O, B, and Si, a compound including at least two of N, Si, O, B, and Si, and a compound including carbon and at least one of N, Si, O, B, and Si.

11. The device according to claim 1, wherein the bulk material is coated with a plurality of hard-material layers including one of C, N, Si, O, and B, and a mixture including at least two of C, N, Si, O, and B.

12. The device according to claim 1, wherein the bulk material is coated with a plurality of plasma polymer layers admixed with one of carbides, oxides, borides, sulphides, silicides, and a mixture of at least two of carbides, oxides, borides, sulphides, and suicides at a concentration of 0 to 50% by volume.

* * * * *